United States Patent [19]

DeMatos et al.

[11] Patent Number: 4,675,790
[45] Date of Patent: Jun. 23, 1987

[54] THREE TERMINAL ELECTROLYTIC CAPACITOR FOR SURFACE MOUNTING

[75] Inventors: Henrique V. DeMatos; Bernd K. Scheumann, both of Greenville; Charles M. Culbertson, II, Gray Court, all of S.C.

[73] Assignee: Union Carbide Corporation, Danbury, Conn.

[21] Appl. No.: 820,097

[22] Filed: Jan. 21, 1986

[51] Int. Cl.⁴ .......................... H01G 9/00; H05K 1/16
[52] U.S. Cl. ..................................... 361/433; 361/402
[58] Field of Search .......... 361/400, 402, 404, 433 A, 361/433 S, 433 C, 306

[56] References Cited

U.S. PATENT DOCUMENTS

| 3,588,628 | 6/1971 | Peck | 361/433 C |
| 4,488,204 | 12/1984 | Beck | 361/433 C |
| 4,539,623 | 9/1985 | Irikura et al. | 361/433 C |
| 4,581,479 | 4/1986 | Moore et al. | 361/308 X |

Primary Examiner—Donald A. Griffin
Attorney, Agent, or Firm—E. Lieberstein

[57] ABSTRACT

Encapsulated three terminal polar electrolytic capacitor device suitable for surface mounting on circuit board or other flat substrate and not vulnerable to reverse circuit connection.

4 Claims, 8 Drawing Figures

THREE TERMINAL ELECTROLYTIC CAPACITOR FOR SURFACE MOUNTING

The present invention is directed to a capacitance device and more particularly to a three terminal polar solid tantalum capacitor device which can be surface mounted on circuit boards and which is not vulnerable to reverse circuit connection.

Solid electrolytic tantalum capacitors of the type disclosed in U.S. Pat. No. 3,166,693 are widely used in the electronics industry because of their high volumetric efficiency, solid state construction and general stability. Such capacitors are particularly useful in the computer industry because of the above and other advantages.

However, solid electrolytic tantalum capacitors are polar devices, i.e., they have distinct positive and negative terminals and, if connected to a circuit with incorrect polarity, the capacitors usually fail catastrophically with the possibility of heat damage to associated components.

A solid tantalum capacitance device for mounting by insertion in pre-positioned holes in a circuit board is disclosed in U.S. Pat. No. 4,097,916. The device of above-noted patent has four lead wires for insertion in a circuit board and is not capable of being effectively surface mounted and electrically connected to "lands" on the surface of a circuit board.

It is accordingly an object of the present invention to provide a three terminal solid polar tantalum capacitance device which is surface mountable on the lands of a circuit board and is not vulnerable to reverse insertion.

Other objects will be apparent from the following description and claims taken in conjunction with the drawing wherein FIGS. 1(a) and 1(b) show a prior art conventional solid tantalum capacitor;

A capacitor device in accordance with the present invention comprises, a porous tantalum anode body of generally rectangular cross-section having (i) front, rear, bottom, top and opposing side surfaces with portions of said bottom and side surfaces being provided with cathode metallization, (ii) a tantalum anode lead wire extending from said front surface; a U-shaped metal channel formed from metal strip, said channel having a length slightly greater than the front-to-rear length of said capacitor body to receive said capacitor body in a nesting engagement with the front surface of the tantalum anode body being spaced from the channel surface opposite thereto and a thin layer of electrically insulating material being provided between said channel and the bottom and rear surfaces of the tantalum anode body, said channel having a depth equal to about the distance from the tantalum lead wire to the bottom surface of said tantalum anode body, and said channel having a pair of oppositely extending ledge tabs, the ledge tab adjacent the front surface of the tantalum body being welded to said anode lead wire of said tantalum anode body; a pair of metal cathode lead tabs electrically connected to and extending from respective opposing metallized side surfaces of the tantalum anode body; encapsulant insulating material being molded in a shape of substantially rectangular cross-section completely about said tantalum anode body and relatively small adjacent portions of said ledge tabs and cathode lead tabs, the portions of said ledge tabs and said cathode lead tabs extending outside said encapsulant insulating material being deformed into L-shaped elements parallel to said encapsulated insulating material and having their respective terminal portions lying in a common plane and spaced away from each other.

Figures 1A, 1B, 2:
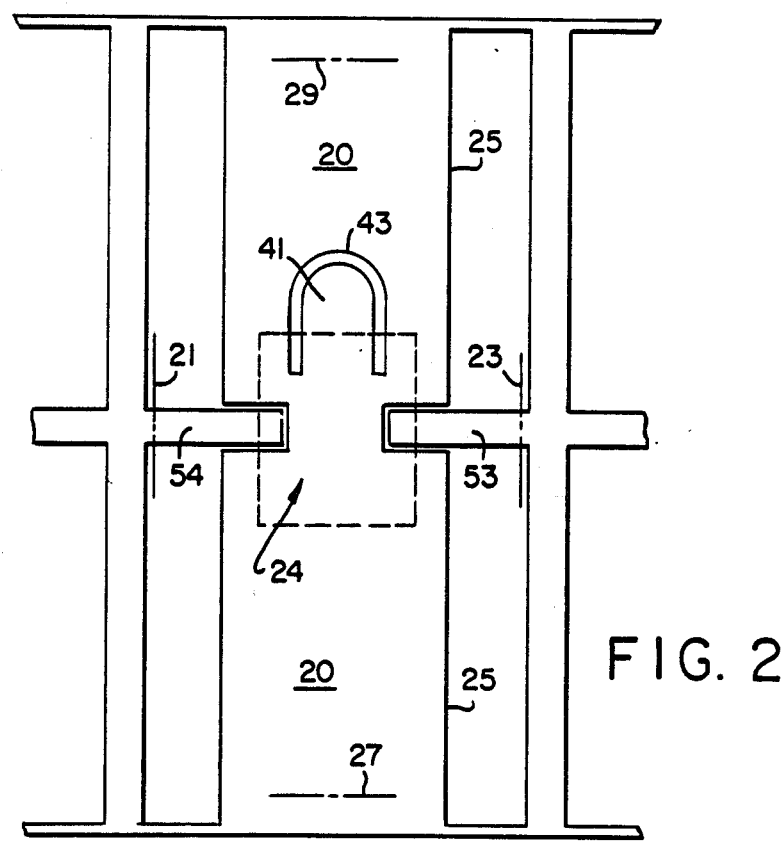
FIG. 2 shows a lead frame configuration suitable for the practice of the present invention.

With reference to FIGS. 1(a) and 1(b) a tantalum porous anode body dielectric and solid electrolyte of the type disclosed in U.S. Pat. No. 4,097,916 is indicated generally at 10 having most of its surface conventionally covered with cathode metallization 12, e.g., silver or plasma-sprayed copper; the tantalum anode lead wire of the body 10 is shown at 14. In the practice of the present invention a metal strip lead frame 20, comprising strips 25, 53, and 54 of the type shown in FIG. 2 is utilized by die pressing downward at region 24, to form a "nest" for a capacitor body of the type shown in FIG. 1, welding and soldering the capacitor body to portions of the lead frame, and susequently cutting the lead frame at 21, 23, 27 and 29 to obtain the channel and tab configuration of FIG. 3.

Figure 3:
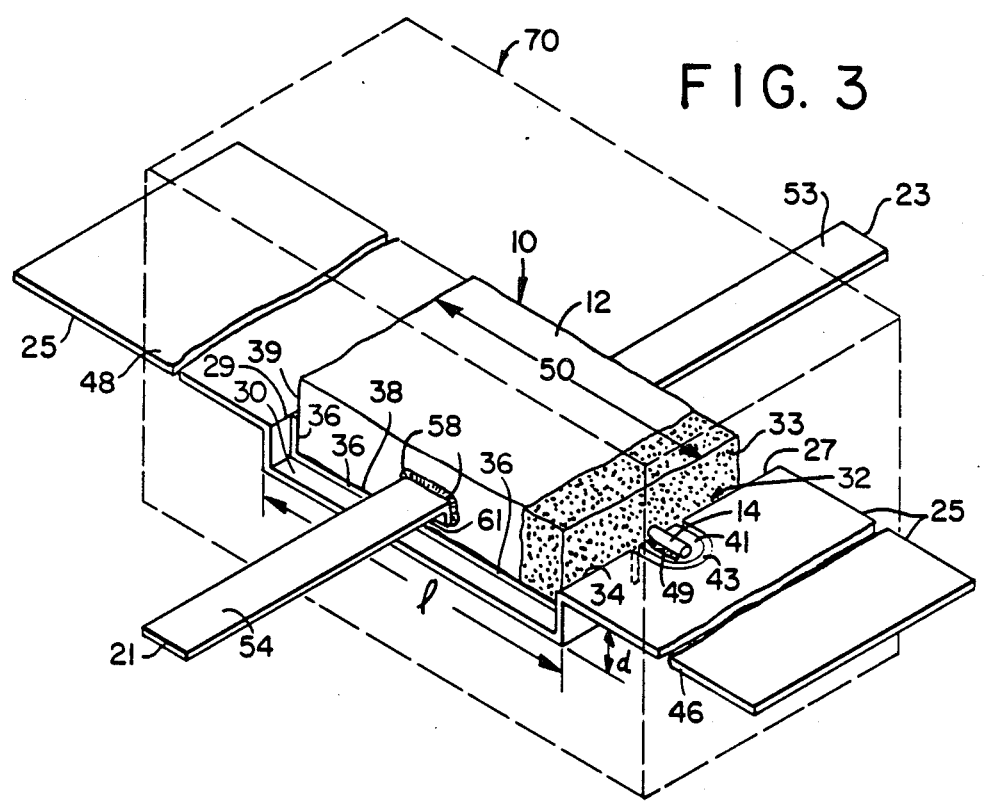
FIGS. 3 and 4 show the fabrication of the capacitance device of the present invention using the lead frame of FIG. 2.

With reference to FIG. 3, the die pressing of lead frame 20 results in the formation of a U-shaped channel 30 from metal strip 25, having a length "1" which is slightly greater (e.g., 10–50 mil greater) than the front-to-rear length 50 of tantalum anode body 10 so that anode body 10 can be placed in nesting engagement in channel 30 and arranged so that a space, e.g., 10–50 mils, exists at 32 to avoid electrical contact between the front surface 33 of anode body 10 and the opposite channel surface 34 to avoid short circuiting of the capacitor; an electrical insulating layer 36, e.g., polyimide tape, or an epoxy coating on either the lead strip or the anode body surfaces adjacent to the lead strip, is placed between the channel 30 and the bottom surface 38 and the rear surface 39 of tantalum anode body 10 to avoid short circuiting of the anode body 10. The depth "d" of channel 30 is equal to about the distance from lead wire 14 to the bottom of channel 30, taking into account the thickness of insulating layer 36, so that anode lead wire 14 rests on, and is welded to, section 41 of strip 25. It is desirable to cantilever section 41 as shown in FIG. 3 in order to minimize the transmission of stress to the anode lead during assembly and molding operations. Such stresses can damage the thin dielectric layer of the capacitor element. Cantilevered section 41 is formed by providing a U-shaped slot 43 in strip 25 of lead frame 20, which is die pressed, as described above, with the result that ledge tabs 46 and 48 of channel 30 are formed in strip 25. Cantilever section 41 in ledge tab 46, upon welding to anode lead wire 14, as indicated at 49, provides the sole electrical connection with strip 25, and is the only mechanical support for capacitor body 10 other than tabs 53 and 54 until subsequent encapsulation is provided. Cathode lead tabs 53, 54 in a common plane with ledge tabs 46 and 48 are soldered at 58 to the respective opposing metallized side surfaces of anode body 10, the bent downward portions 61 being formed during die pressing of the lead frame 20 for convenience in soldering. Conductive adhesives can also be used to effect this joint. Following welding and soldering an encapsulation of electrically insulating material 70 is provided by conventional molding techniques to surround completely the tantalum anode body 10, channel 30, and relatively small adjacent portions of the ledge tabs 46, 48 and cathode lead tabs 53, 54.

Figure 4:
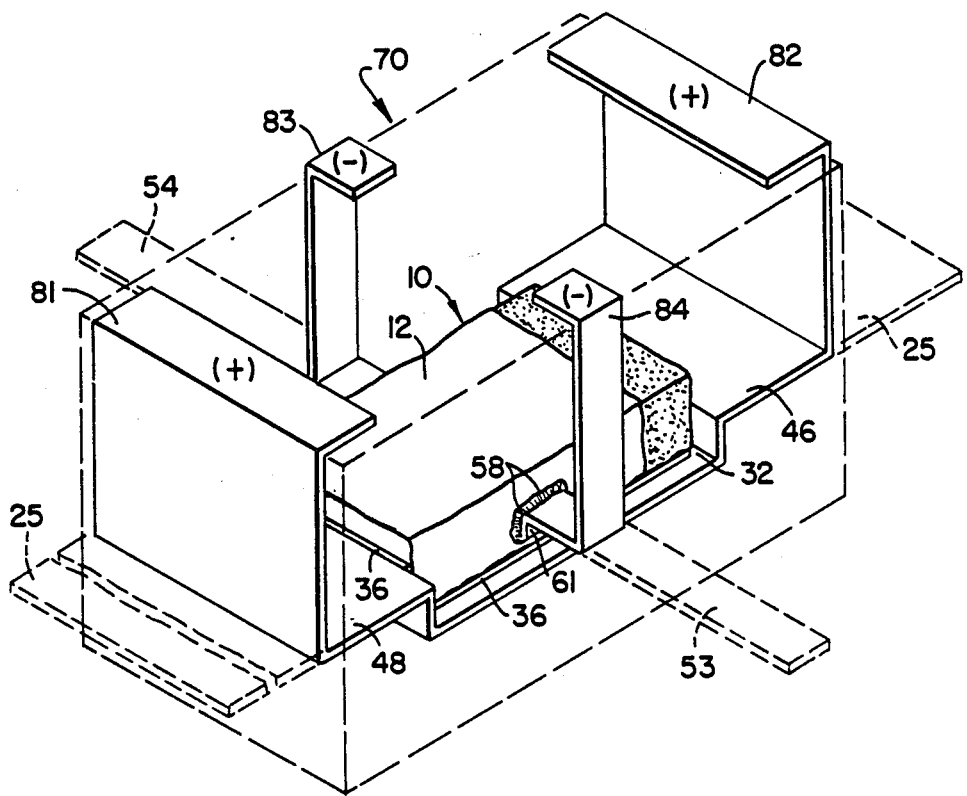

With reference to FIG. 4, following encapsulation with encapsulant 70 to provide a shape of substantially rectangular cross-section the portions of ledge tabs 46 and 48, and cathode lead tabs 54, 53, which extend outside the encapsulant 70 are deformed into respective L-shaped elements 81 and 82 and 83 and 84 to lie parallel to encapsulant 70, and have their respective terminal portions lie in a common plane and are spaced from each other. In FIG. 3, the opposing terminal portions of tabs 81, 82 provide the positive terminal for the capacitive device and the terminal portions of tabs 83, 84 provide the negative terminals. All terminal portions are in a common plane which is parallel to the top surface 12 of anode body 10.

Figure 5B:
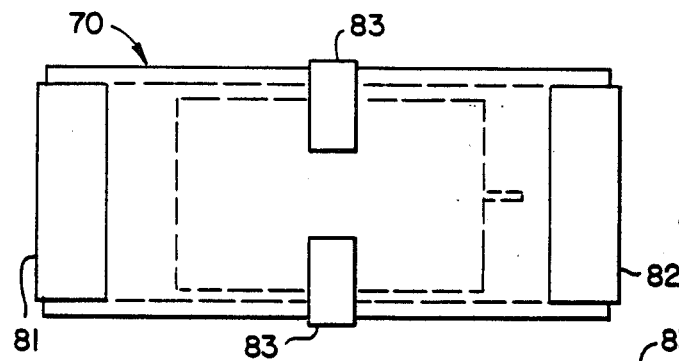
FIG. 5(b) shows a view in elevation of the capacitance device of FIG. 4.
Figure 5A:
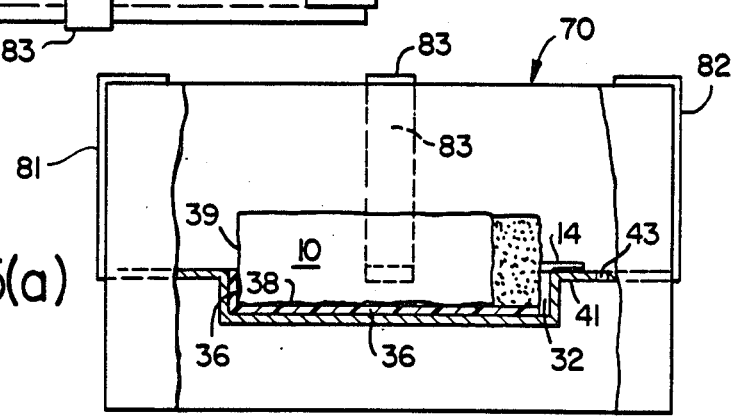
FIG. 5(a) shows a plan view of the capacitance device of FIG. 4.
Figure 6:
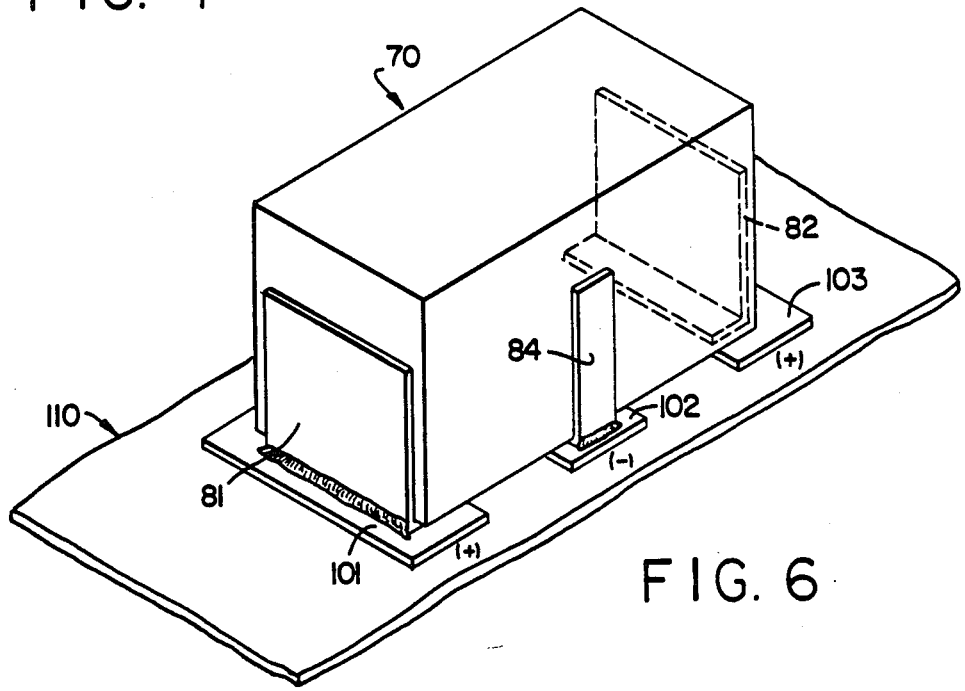
FIG. 6 shows the capacitance device of the present invention mounted on a circuit board.

FIGS. 5(a) and 5(b) show a plan and elevational view of the device of FIG. 4; FIG. 6 shows the device of FIG. 3 surface mounted on lands 101, 102, 103 of a circuit board 110.

The present invention provides significant advantages, for example:

(1) The terminal polarity remains unchanged with a 180 degree rotation of the capacitor around a vertical axis, thereby avoiding inadvertent reverse placement.

(2) All the exterior terminals extend up the side walls of the molded capacitor body to permit the solder fillets to be easily inspected. (See FIG. 6)

(3) The lead strips on the sides and ends lie in a single plane which greatly simplifies the design and construction of assembly tooling and molds.

(4) A 5-sided nest is created to position accurately the anode body with respect to the leads, molds, etc.

(5) All the lead strips can be made from a single lead frame, as shown in FIG. 2.

(6) Stress relief for the anode lead can easily be built into the design.

What is claimed is:

1. A capacitor device comprising a porous tantalum anode body of generally rectangular cross-section having (i) front, rear, bottom, top and opposing side surfaces with portions of said bottom and side surfaces being provided with cathode metallization, (ii) a tantalum anode lead wire extending from said front surface; a U-shaped metal channel formed from metal strip, said channel having a length slightly greater than the front-to-rear length of said capacitor body to receive said capacitor body in a nesting engagement with the front surface of the tantalum anode body being spaced from the channel surface opposite thereto and a thin layer of electrically insulating material being provided between said channel and the bottom and rear surfaces of the tantalum anode body, said channel having a depth equal to about the distance from the tantalum lead wire to the bottom surface of said tantalum anode body, and said channel having a pair of oppositely extending ledge tabs, the ledge tab adjacent the front surface of the tantalum body being welded to said anode lead wire of said tantalum anode body; a pair of metal cathode lead tabs electrically connected to and extending from respective opposing metallized side surfaces of the tantalum anode body; encapsulant insulating material being molded in a shape of rectangular cross-section completely about said tantalum anode body and said channel and relatively small adjacent portions of said ledge tabs and cathode lead tabs, the portions of said ledge tabs and said cathode lead tabs extending outside said encapsulant insulating material being deformed into L-shaped elements parallel to said encapsulated insulating material and having their respective terminal portions lying in a common plane and spaced away from each other.

2. Capacitor according to claim 1 in which the cathode lead tabs and the ledge tabs lies in the same plane.

3. A method for making a capacitor as described in claim 2 which comprises the use of a single lead frame containing the ledge tabs, the channel and the cathode lead tabs.

4. Capacitor according to claim 1 in which the ledge tab adjacent to the front surface of the tantalum body is slotted to provide a relatively small cantilevered section to which the anode lead wire is welded.

* * * * *